United States Patent [19]

Tuthill et al.

[11] Patent Number: 4,558,242
[45] Date of Patent: Dec. 10, 1985

[54] EXTENDED REFERENCE RANGE, VOLTAGE-MODE CMOS D/A CONVERTER

[75] Inventors: Michael G. Tuthill, Limerick; Paschal Minogue, Portroe, both of Ireland

[73] Assignee: Analog Devices, Incorporated, Norwood, Mass.

[21] Appl. No.: 465,493

[22] Filed: Feb. 11, 1983

[51] Int. Cl.[4] .................... H03K 17/16; H03K 17/693
[52] U.S. Cl. .................................... 307/577; 307/297; 307/579; 340/347 CC
[58] Field of Search ............... 307/200 B, 243, 296 R, 307/297, 304, 491, 495–497, 499–501, 577, 579; 340/347 DA, 347 CC

[56] References Cited

U.S. PATENT DOCUMENTS

| | | | |
|---|---|---|---|
| 4,267,550 | 5/1981 | Cecil | 340/347 DA |
| 4,308,467 | 12/1981 | Kolluri et al. | 307/304 |
| 4,338,590 | 7/1982 | Connolly, Jr. et al. | 340/347 CC |
| 4,410,880 | 10/1983 | Zaborowski | 340/347 DA |
| 4,464,588 | 8/1984 | Wieser | 307/297 |
| 4,495,425 | 1/1985 | McKenzie | 307/297 |

FOREIGN PATENT DOCUMENTS 2054996  2/1981  United Kingdom ........ 340/347 DA

OTHER PUBLICATIONS

Schade, Jr., "Voltage Matching Circuit for Ladder Network", RCA Tech. Notes, TN No. 1271, Princeton, NJ, Mar. 1981, pp. 1–3.

Primary Examiner—Stanley D. Miller
Assistant Examiner—D. R. Hudspeth
Attorney, Agent, or Firm—Parmelee, Bollinger & Bramblett

[57] ABSTRACT

A CMOS D/A converter for use in a voltage-mode and having complementary-driven switch pairs for $V_{ref}$ and $A_{gnd}$ respectively. The "ON" gate voltage of the $A_{gnd}$ switch is adjusted in accordance with the value of $V_{ref}$, to give switch $V_{GS}$ equality and therefore "ON" resistance matching with the $V_{ref}$ switch over a wide range of reference voltage. Circuits are shown for developing the $A_{gnd}$ gate voltage varying with $V_{ref}$.

6 Claims, 11 Drawing Figures

EXTENDED REFERENCE RANGE, VOLTAGE-MODE CMOS D/A CONVERTER

BACKGROUND OF THE INVENTION

1. Field of the Invention

This invention relates to digital-to-analog (D/A) converters. More particularly, this invention relates to D/A converters using complementary-driven CMOS switches to produce a voltage-mode output signal.

2. Description of the Prior Art

Referring to FIG. 1, the basic voltage-mode (or voltage-switching) CMOS D/A converter includes a thin-film R/2R ladder network 20 and pairs of n-channel MOS switches generally indicated at 22. Each complementary-driven switch pair consists of a $V_{ref}$ (reference voltage) switch and an $A_{gnd}$ (analog ground) switch, the "ON" switch being determined by the corresponding input code bit to the converter. The ladder network termination is connected to $A_{gnd}$ via a permanently "ON" $A_{gnd}$ switch.

Because of the nature of the R/2R ladder network and the fact that switch "ON" resistance ($R_{ON}$) is finite (i.e. $r > 0$), the $R_{ON}$'s conventionally are binarily weighted. This is done by weighting the device geometries, of both the $V_{ref}$ and $A_{gnd}$ switches, in a binary fashion. Also, it is important that switch pair "ON" resistances match as closely as possible, i.e. ideally:

$$R_{ONVref} = R_{ONAgnd},$$

for a given switch pair.

Referring now to FIG. 2, there is shown a known switch pair arrangement 22A, 22B sometimes employed when a conventional current-mode D/A converter is used in the voltage mode. Important characteristics of this configuration are:

(a) $(W/L)_V = (W/L)_A = (W/L)$. The $V_{ref}$ and $A_{gnd}$ switches are the same size. (Subscript V identifies the $V_{ref}$ switch, the subscript A identifies the $A_{gnd}$ switch.)

(b) Both devices occupy the same p-well, which is connected to $A_{gnd}$.

(c) Both devices have "ON" gate voltages of $V_{DD}$.

Assuming non-saturated device operation, expressions for the "ON" resistances of the switches can be developed from the basic current equation:

$$I_{DS} = \beta' n (W/L)[(V_{GS} - V_T)V_{DS} - \tfrac{1}{2}V_{DS}^2],$$

Where
$\beta'n = C_{ox}\bar{\mu} = (k_{ox}\epsilon_o\bar{\mu}/t_{ox})$,
$\bar{\mu}$ = Effective channel mobility,
$V_T$ = threshold voltage,
W = effective channel width and
L = effective channel length (i) This relationship can be developed for the $V_{ref}$ Switch as follows:

$$I_{DSV} = \beta'n \left(\frac{W}{L}\right)_V [(V_{GSV} - V_{TV})V_{DSV} - \tfrac{1}{2}V_{DSV}^2]$$

$$= \beta'n \left(\frac{W}{L}\right) [(V_{DD} - (V_{ref} - V_{DSV}) - V_{TV})V_{DSV} - \tfrac{1}{2}V_{DSV}^2]$$

$$= \beta'n \left(\frac{W}{L}\right) [(V_{DD} - V_{ref} - V_{TV})V_{DSV} + \tfrac{1}{2}V_{DSV}^2]$$

$$\frac{1}{R_{ONV}} \triangleq \frac{\partial I_{DSV}}{\partial V_{DSV}} = \beta'n \left(\frac{W}{L}\right)[(V_{DD} - V_{ref} - V_{TV}) + V_{DSV}]$$

$$\rightarrow R_{ONV} = \frac{1}{\beta'n \left(\frac{W}{L}\right)[V_{DD} - V_{ref} - V_{TV} + V_{DSV}]}$$

(ii) A corresponding relationship can be developed for the $A_{gnd}$ Switch as follows:

$$I_{DSA} = \beta'n \left(\frac{W}{L}\right)_A [(V_{GSA} - V_{TA})V_{DSA} - \tfrac{1}{2}V_{DSA}^2]$$

$$= \beta'n \left(\frac{W}{L}\right) [(V_{DD} - V_{TA})V_{DSA} - \tfrac{1}{2}V_{DSA}^2]$$

$$\frac{1}{R_{ONA}} \triangleq \frac{\partial I_{DSA}}{\partial V_{DSA}} = \beta'n \left(\frac{W}{L}\right) [V_{DD} - V_{TA} - V_{DSA}]$$

$$\rightarrow R_{ONA} = \frac{1}{\beta'n \left(\frac{W}{L}\right)[V_{DD} - V_{TA} - V_{DSA}]}$$

At the drain of each device, the threshold voltage is given by:

(i) $V_{ref}$ Switch: $V_{TV} = V_{TO} + M[\sqrt{V_{ref} + 2\phi_F} - \sqrt{2\phi_F}]$ (ii) $A_{gnd}$ Switch: $V_{TA} = V_{TO} + M[\sqrt{V_{DSA} + 2\phi_F} - \sqrt{2\phi_F}]$ Where the body effect factor, $$M = \frac{t_{ox}}{k_{ox}} \sqrt{\frac{2k_{si}qN_B}{\epsilon_o}}$$ and $\phi_F$ is the Fermi potential.

From the above expressions, it is apparent that in the known switch configuration of FIG. 2 there exists an inherent switch $R_{ON}$ mismatch (i.e. $R_{ONV} > R_{ONA}$) due to discrepancies between the $V_{GS}$, $V_T$ and $V_{DS}$ values of the $V_{ref}A_{gnd}$ devices. The fact that this $R_{on}$ mismatch worsens as $V_{ref}$ increases, results in a restricted reference voltage range for the converter.

On the other hand, the FIG. 2 arrangement has the advantages of: (i) Relatively small die area, since all the switches can be contained within one p-well connected to $A_{gnd}$, and (ii) ease of adaptability to current-mode operation since the configuration is originally designed for use in that mode.

FIG. 3 shows another known switch pair configuration directed to achieving $R_{ON}$ matching in a D/A converter designed specifically for use in the voltage mode. This switch pair arrangement 22C, 22D has the following important features:

(a) $(W/L)_V > (W/L)_A$. This (W/L) mismatch is deliberately introduced.

(b) The $V_{ref}$ and $A_{gnd}$ devices occupy separate p-wells.

(c) Both devices have "ON" gate voltages of $V_{DD}$.

In this case, the "ON" resistances expressions are:

(i) $V_{ref}$ Switch: $R_{ONV} =$ $$\frac{1}{\beta'n \left(\frac{W}{L}\right)_V [V_{DD} - V_{ref} - V_{TV} + V_{DSV}]}$$

(ii) $A_{gnd}$ Switch: $R_{ONA} =$ $$\frac{1}{\beta'n \left(\frac{W}{L}\right)_A [V_{DD} - V_{TA} - V_{DSA}]}$$

The drain threshold voltages are:

(i) $V_{ref}$ Switch: $V_{TV} = V_{TO} + M[\sqrt{V_{DSV} + 2\phi_F} - \sqrt{2\phi_F}]$ (ii) $A_{gnd}$ Switch: $V_{TA} = V_{TO} + M[\sqrt{V_{DSA} + 2\phi_F} - \sqrt{2\phi_F}]$ Because the $V_{ref}$ devices have individual p-wells, their threshold voltages are now lower than the corresponding threshold voltages in FIG. 2 (due to reduced body effect) and they match their $A_{gnd}$ counterparts more closely.

Equating $R_{ON}$'s shows that a (W/L) mismatch can be deliberately introduced to give a first order compensation for the inherent switch $V_{GS}$ mismatch, at a given value of $V_{ref}$:

$$\frac{\left(\frac{W}{L}\right)_V}{\left(\frac{W}{L}\right)_A} = \frac{V_{DD} - V_{TA} - V_{DSA}}{V_{DD} - V_{ref} - V_{TV} + V_{DSV}}$$

The advantage of this arrangement over that of FIG. 2 is an increase in the upper limit of the value of the reference voltage which can be employed. Disadvantages include: (i) A relatively large die area, since each $V_{ref}$ switch requires its own separate p-well; and (ii) a reference voltage range restricted to values close to the particular value of $V_{ref}$ which satisfies the above equation.

SUMMARY OF THE INVENTION

In order to optimize the accuracy of a CMOS converter operated in a voltage mode, it is important that, for a given switch pair, the "ON" resistance of a $V_{ref}$ switch matches that of the corresponding $A_{gnd}$ switch as closely as possible. The present invention is directed to an arrangement for achieving such a resistance match over a relatively wide range of reference voltages. In a preferred embodiment of the invention to be described hereinbelow in detail, this result is obtained by adjusting the gate voltage of the $A_{gnd}$ switch in accordance with the value of $V_{ref}$ to give switch $V_{GS}$ equality and therefore "ON" resistance matching over a wide range of reference voltage. This result advantageously allows the voltage-mode D/A converter to have multiplying capability.

BRIEF DESCRIPTON OF THE DRAWINGS

DETAILED DESCRIPTION OF PREFERRED EMBODIMENTS

Figure 1:
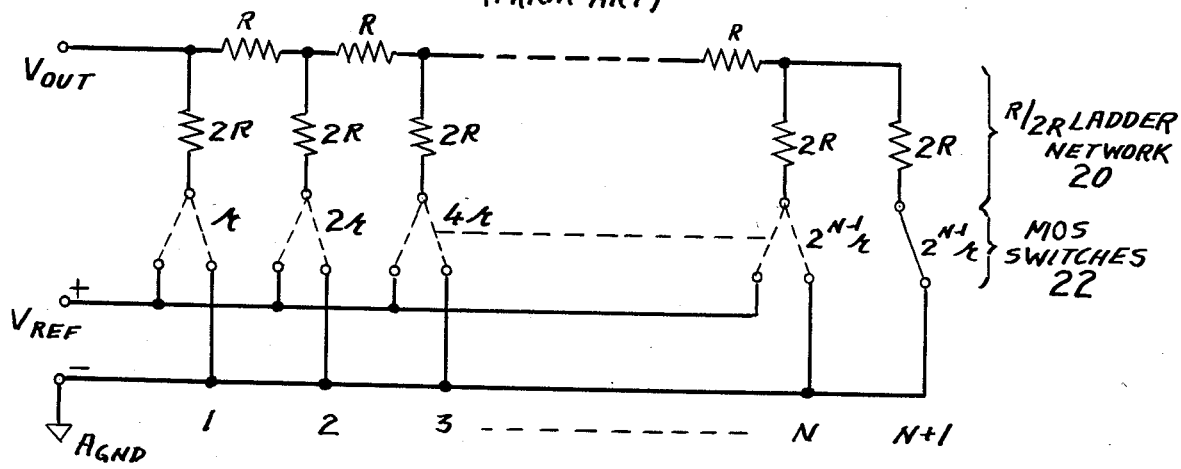
FIG. 1 shows basic elements of a conventional DMOS D/A converter.
Figure 2:
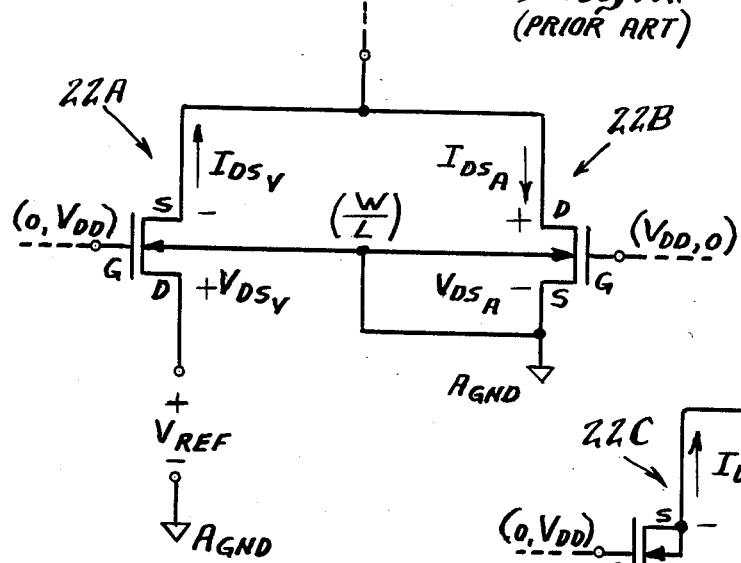
FIG. 2 shows a known switch pair configuration for adapting a conventional current-mode converter to voltage-mode operation.
Figure 3:
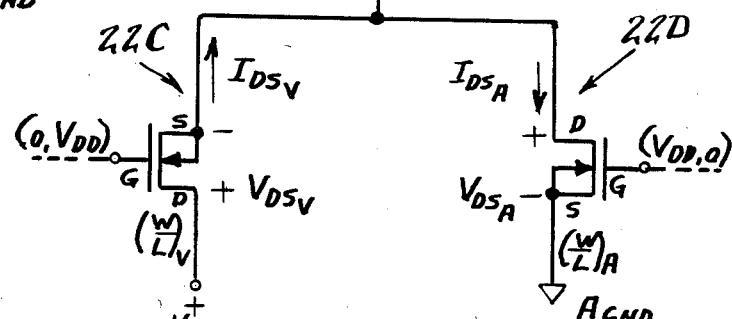
FIG. 3 shows a known switch-pair configuration for use in a voltage-mode D/A converter, and providing "ON" resistance match at one value of reference voltage.
Figure 4:
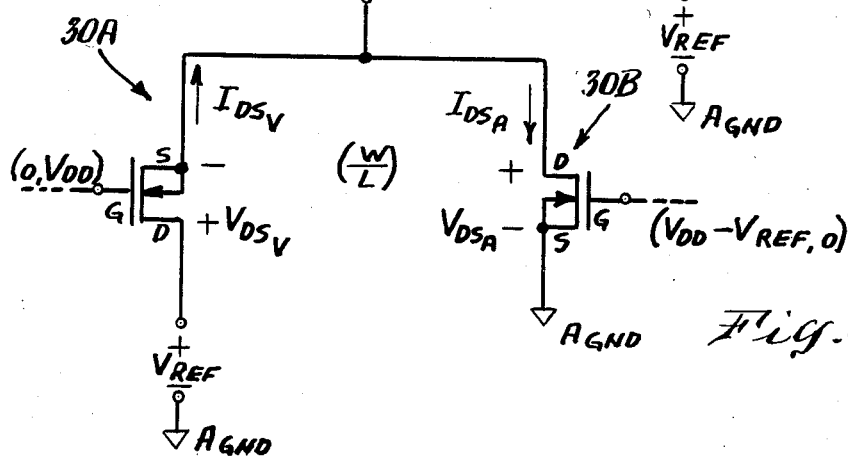
FIG. 4 shows a switch-pair configuration in accordance with the invention.

Referring now to FIG. 4, there is shown a basic CMOS switch pair arrangement 30A, 30B in accordance with this invention. This configuration comprises the following characteristics:

(a) $(W/L)_V = (W/L)_A = (W/L)$. The $V_{ref}$ and $A_{gnd}$ switches are the same size.

(b) The $V_{ref}$ and $A_{gnd}$ devices occupy separate p-wells.

(c) The "ON" gate voltage of the $A_{gnd}$ switch is $V_{DD} - V_{ref}$, whereas that of the $V_{ref}$ switch is $V_{DD}$.

The relevant $R_{ON}$ expressions are:

(i) $V_{ref}$ Switch: $R_{ONV} =$ $$\frac{1}{\beta'n \left(\frac{W}{L}\right) [V_{DD} - V_{ref} - V_{TV} + V_{DSV}]}$$

(ii) $A_{gnd}$ Switch: $R_{ONA} =$ $$\frac{1}{\beta'n \left(\frac{W}{L}\right) [V_{DD} - V_{ref} - V_{TA} - V_{DSA}]}$$

The drain threshold voltages are:

(i) $V_{ref}$ Switch: $V_{TV} = V_{TO} + M[\sqrt{V_{DSV} + 2\phi_F} - \sqrt{2\phi_F}]$ (ii) $A_{gnd}$ Switch: $V_{TA} = V_{TO} + M[\sqrt{V_{DSA} + 2\phi_F} - \sqrt{2\phi_F}]$ It will be seen from the above $R_{ON}$ expressions that both the $V_{ref}$ and the $A_{gnd}$ switch $R_{ON}$'s are a function of $V_{ref}$, and provide a close match for a wide range of $V_{ref}$.

Figure 5:
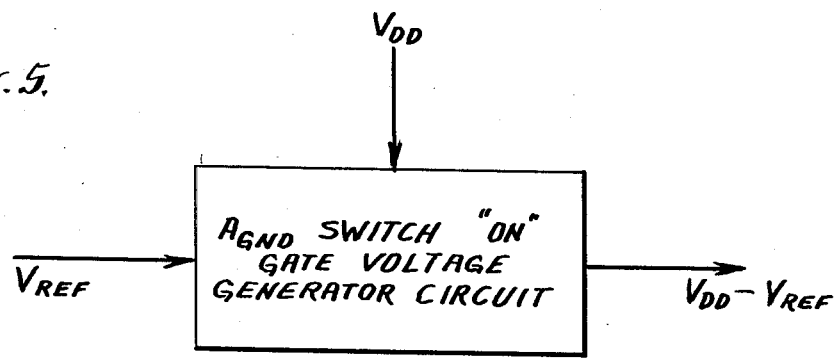
FIG. 5 is a block diagram of a gate-voltage generator for the $A_{gnd}$ switch of FIG. 4.

FIG. 5 shows in block format an $A_{gnd}$ switch "ON" gate voltage generator circuit for use with the FIG. 4 configuration. The output voltage of this generator circuit provides the positive power supply rail for all the $A_{gnd}$ switch drivers.

Figure 6:
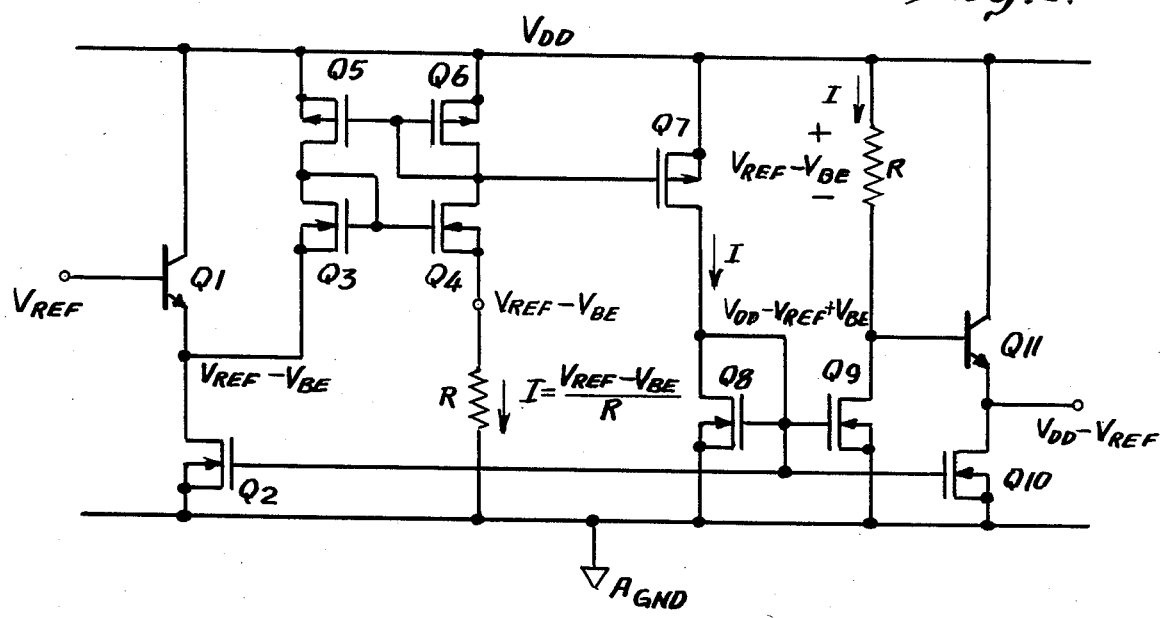
FIG. 6 illustrates one gate-voltage generator circuit suitable for fabrication on an integrated circuit.
Figure 7:
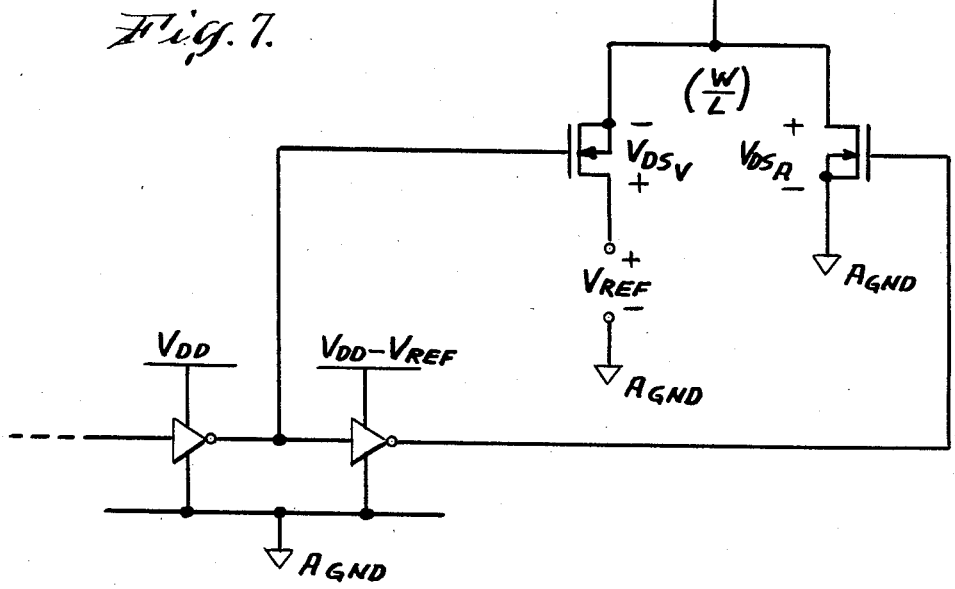
FIG. 7 shows a switch-driver circuit.

FIG. 6 is a schematic of a particular circuit, suitable for fabrication on an integrated circuit, which implements the required gate-voltage function. This $V_{DD} - V_{ref}$ generator circuit provides the positive power supply rail for the $A_{gnd}$ switch driver shown in FIG. 7.

The operation of the generator circuit in FIG. 6 may be explained as follows:

The input voltage, $V_{ref}$, is applied to the emitter follower formed by Q1 and Q2. The emitter follower output is $V_{ref}-V_{be}$. Devices Q3–Q6 form a double current mirror which reproduces $V_{ref}-V_{be}$ at the source of Q4, thereby setting up a current $(V_{ref}-V_{be})/R$ through the resistance R. This current is mirrored by devices Q7–Q9 into an identical resistance R, resulting in a Q11 base voltage of $V_{DD}-V_{ref}+V_{be}$ which appears as $V_{DD}-V_{ref}$ at the output of the emitter follower formed by Q10 and Q11. It may particularly be noted that the $V_{be}$ term, inevitably introduced by the emitter follower at the output, is compensated by the introduction of a similar $V_{be}$ term by the emitter follower at the input.

Figure 8A:
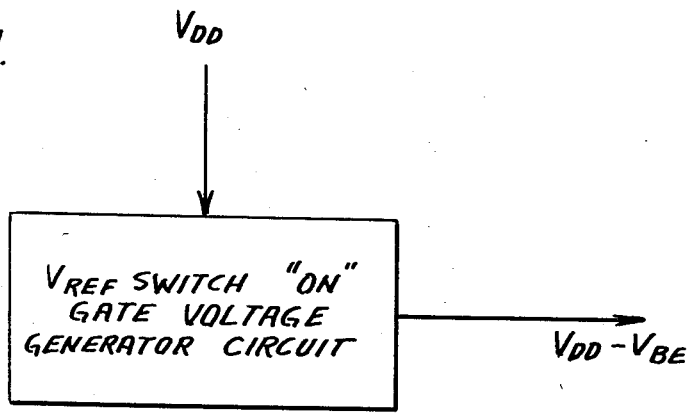
FIGS. 8A and 8B are block diagrams illustrating an alternative gate-voltage generator.
Figure 8B:
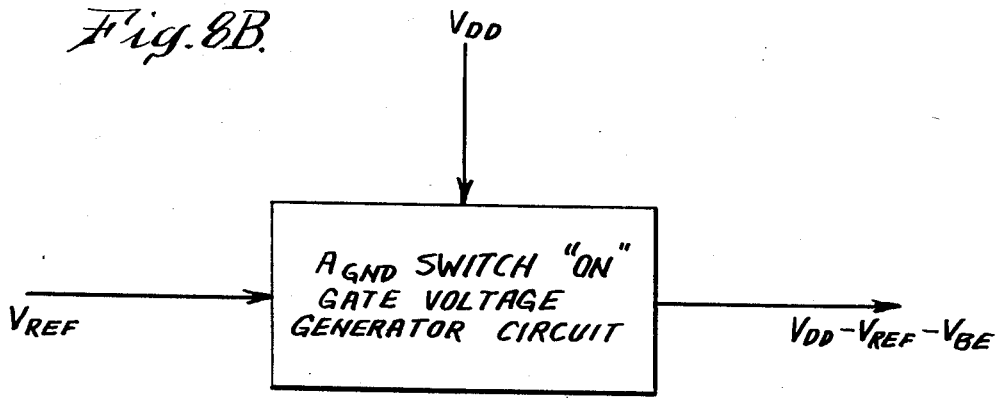
Figure 9:
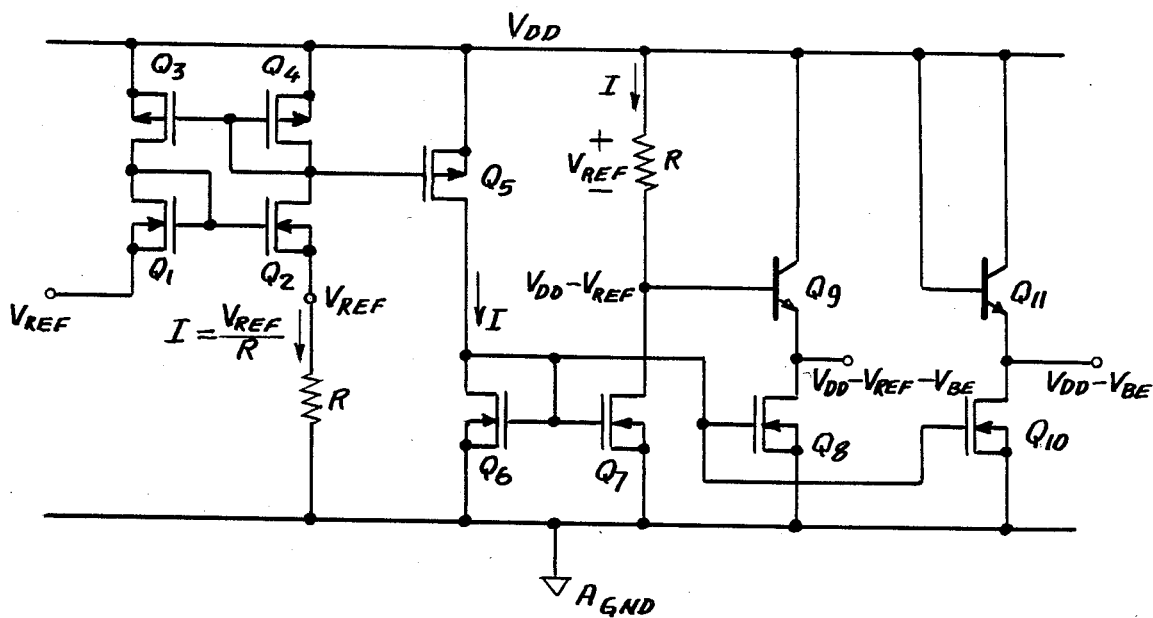
FIG. 9 shows one circuit schematic for a gate-voltage generator of the kind shown in FIGS. 8A and 8B.
Figure 10:
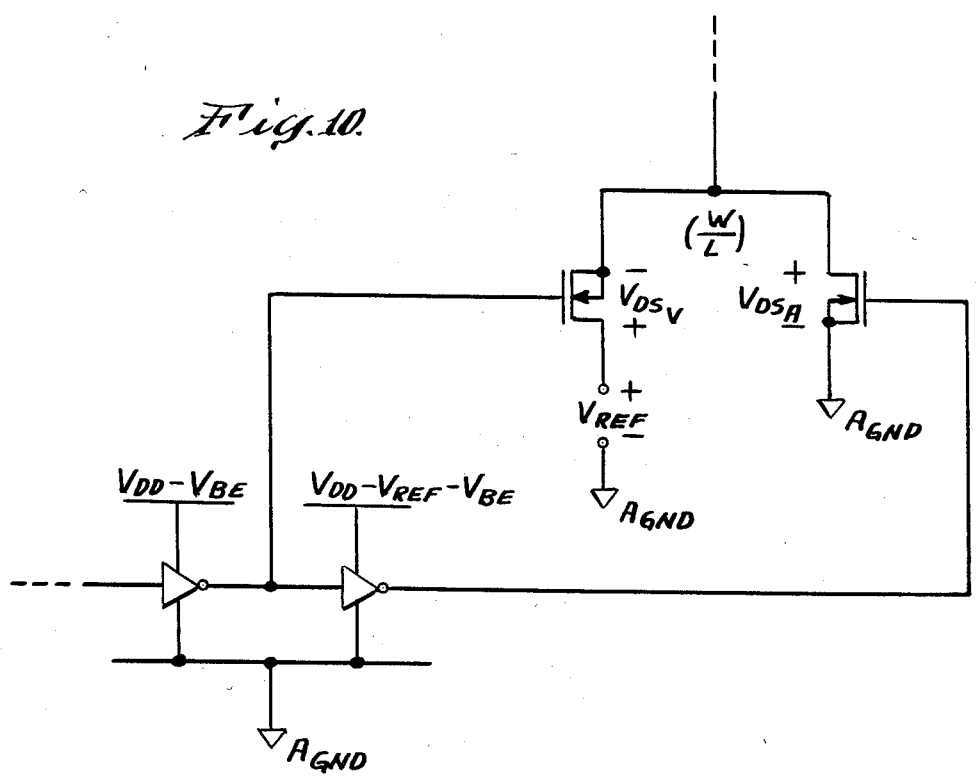
FIG. 10 shows a switch driver circuit for use with the generator circuit of FIG. 9.

FIGS. 8A and 8B show an alternative arrangement for providing $V_{be}$ compensation. This approach uses both a $V_{ref}$ and an $A_{gnd}$ switch "ON" gate voltage generator circuit. A particular circuit schematic is given in FIG. 9, for use with the corresponding switch driver arrangement of FIG. 10.

Some important aspects of the basic generator circuit design are:

(A) Because the most significant D/A converter linearity error, due to switch pair $R_{ON}$ mismatch, occurs when $V_{ref}$ is a maximum, the $A_{gnd}$ switch "ON" gate voltage generator circuit preferably is designed to be most accurate at this particular value. Typically, for a $V_{DD}$ of 15 V, the $V_{DD}-V_{ref}$ generator circuit in FIG. 6 can be designed to handle a reference of 10 V.

(B) A design trade-off exists in the choice of a value for R in FIG. 6. The resistance should be relatively large in order to minimize quiescent power supply current, whereas a small value is desirable to decrease the significance of the base current transients during driver switching.

(C) In order that the particular $R_{ON}$ equations, given previously, remain valid, it is necessary to ensure the non-saturated operation of the $A_{gnd}$ switches. The ladder network termination $A_{gnd}$ switch, with all the $V_{ref}$ switches "ON", represents the worst case.

The following inequality should be considered:

$$V_{GSA} - V_{TA} > V_{DSA} \rightarrow V_{DD} - V_{ref} - V_{TA} > V_{DSA}$$

This means that $I_{DSA\,max}$ must be sufficiently small so that:

$$V_{DSA|max} < (V_{DD} - V_{ref} - V_{TA})|_{min}$$

One method of ensuring that this inequality remains true is to select a sufficiently large value of R in the R/2R ladder network. The problem does not arise in the case of the $V_{ref}$ switches, where the corresponding inequality is independent of $V_{DSV}$:

$$V_{GS} - V_{TV} > V_{DSV} \rightarrow V_{DD} - (V_{ref} - V_{DSV}) - V_{TV} > V_{DSV}$$

$$V_{DD} - V_{ref} - V_{TV} + V_{DSV} > V_{DSV} \rightarrow$$

$$V_{ref|max} < (V_{DD} - V_{TV})|_{min}.$$

Although several preferred embodiments of the invention have been disclosed herein in detail, it is to be understood that this is for the purpose of illustrating the invention, and should not be construed as necessarily limiting the scope of the invention, since it is apparent that many changes can be made by those skilled in the art while still practicing the invention claimed herein.

What is claimed is:

1. In a digital-to-analog converter of the type comprising a plurality of complementary-driven MOS switch pairs for $V_{ref}$ (reference voltage) and $A_{gnd}$ (analog ground) respectively;

that improvement for assuring a close match between the "ON" resistances of the switch pairs over an extended range of values of $V_{ref}$, comprising:

a gate-voltage generator having means producing an $A_{gnd}$ switch gate voltage which varies with changes in $V_{ref}$, and means coupling said switch gate voltage to said $A_{gnd}$ switches.

2. Apparatus as in claim 1, wherein said generator is connected to the supply voltage $V_{DD}$ and the reference voltage $V_{ref}$, and includes means to produce a voltage corresponding to $V_{DD}-V_{ref}$.

3. Apparatus as in claim 1, wherein said generator includes an output circuit having a transistor the $V_{be}$ of which appears as a component of the output signal; and a compensation circuit for said generator including a second transistor applying to said first transistor an input signal including the $V_{be}$ of said second transistor as a component thereof, thereby tending to compensate for the effect of said first $V_{be}$ component on the generated gate voltage.

4. Apparatus as in claim 1, wherein said generator includes circuits to develop both $V_{ref}$ and $A_{gnd}$ switch gate voltages;

said circuits including transistor means introducing in each of said gate voltages a signal component proportional to the $V_{be}$ of at least one transistor of said transistor means.

5. Apparatus as in claim 1, wherein the $V_{ref}$ and $A_{gnd}$ switches of each pair have identical channel widths and channel lengths.

6. Apparatus as in claim 5, wherein the "ON" gate voltage of the $A_{gnd}$ switch is $V_{DD}-V_{ref}$ (where $V_{DD}$ is a supply voltage), and the "ON" gate voltage of the $V_{ref}$ switch is $V_{DD}$.

* * * * *